(12) United States Patent
Zeng et al.

(10) Patent No.: US 8,138,515 B2
(45) Date of Patent: Mar. 20, 2012

(54) SURFACE MOUNTED LED STRUCTURE AND PACKAGING METHOD OF INTEGRATING FUNCTIONAL CIRCUITS ON A SILICON

(75) Inventors: Zhaoming Zeng, Guangzhou (CN); Guowei David Xiao, Guangzhou (CN); Haiying Chen, Guangzhou (CN); Yugang Zhou, Guangzhou (CN); Yu Hou, Guangzhou (CN)

(73) Assignee: APT Electronics Ltd., Guangzhou, Guangdong Province (CN)

( * ) Notice: Subject to any disclaimer, the term of this patent is extended or adjusted under 35 U.S.C. 154(b) by 0 days.

(21) Appl. No.: 13/024,083

(22) Filed: Feb. 9, 2011

(65) Prior Publication Data
US 2012/0025242 A1    Feb. 2, 2012

(30) Foreign Application Priority Data
Jul. 30, 2010   (CN) .......................... 2010 1 0243401

(51) Int. Cl.
*H01L 33/00*    (2010.01)
(52) U.S. Cl. ........................................... 257/98; 257/99
(58) Field of Classification Search ............ 257/98, 257/99
See application file for complete search history.

(56) References Cited

FOREIGN PATENT DOCUMENTS

| CN | 1971952 A | 5/2007 |
|----|-----------|--------|
| CN | 101170151 A | 4/2008 |
| CN | 101752275 C | 6/2010 |

*Primary Examiner* — Douglas Menz
(74) *Attorney, Agent, or Firm* — Robert P. Michal; Lucas & Mercanti, LLP

(57) ABSTRACT

The present invention relates to a surface mounted LED structure of integrating functional circuits on a silicon substrate, comprising the silicon substrate and an LED chip. Said silicon substrate has an upper surface of planar structure without grooves. An oxide layer covers the upper surface of the silicon substrate, and metal electrode layers are arranged in the upper surface of the oxide layer. The upper surfaces of said metal electrode layers are arranged with metal bumps, and the LED chip is flip-chip mounted to the silicon substrate. Two conductive metal pads are arranged on the lower surface of said silicon substrate, said conductive metal pads are electrically connected to the metal electrode layers on the upper surface of the silicon substrate by a metal lead arranged on the side wall of the silicon substrate. A heat conduction metal pad is arranged on the corresponding lower, surface of the silicon substrate just below the LED chip. Peripheral functional circuits required by LED are integrated on the upper surface of said silicon substrate. The structure of the present invention has advantages of good heat dissipation effect and small volume, and direct integration of functional circuits such as protection and drive circuits etc. in the silicon substrate achieves large-scale production package of wafer level, reducing the cost of packaging and lighting fixture.

3 Claims, 7 Drawing Sheets

_US 8,138,515 B2_

SURFACE MOUNTED LED STRUCTURE AND PACKAGING METHOD OF INTEGRATING FUNCTIONAL CIRCUITS ON A SILICON

CROSS-REFERENCE TO RELATED APPLICATION

The present application claims priority of Chinese Patent Application CN201010243401.1 filed Jul. 30, 2010, the entire contents of which is incorporated herein by reference.

FIELD OF THE INVENTION

The present invention belongs to the field of manufacturing a light emitting device, and relates to an LED packaging structure and method based on a silicon substrate.

BACKGROUND OF THE INVENTION

The light emitting diode (LED) source has several advantages of high efficiency, long life and no harmful substances such as Hg and the likes. With the rapid development of LED technology, the LED's performance, such as brightness, lifetime and the likes, have been greatly improved, such that it has found an increasing application in a variety of areas ranging from outdoor lighting such as street lamps to indoor lighting such as decorative lights, in which LED is used or replaced as a light source.

The LED packaging structure of surface mounted type (SMD) has become a major form of package for its advantages of application convenience and small volume. Refer to FIG. 1, which is a surface mounted LED structure commonly used in prior art, including a packaging bracket 100 and an LED chip 200 mounted in the packaging bracket 100 by die attach process. Metal leads 500 are arranged on the surface of the packaging bracket 100. Electrodes 400 are arranged on the leads 500 on both sides of the LED chip 200. The positive and negative electrodes of the LED chip 200 are electrically connected to the electrodes 400 on the packaging bracket 100 by gold wires 300, respectively. Through phosphor coating and adhesive encapsulating processes, an encapsulation adhesive 600 is filled above the LED chip 200, thereby completing the packaging of the LED chip 200. However, there are the following problems with this present surface mounted LED structure: because the packaging bracket 100 is fanned by using a metal bracket as the substrate and then cutting it after an adhesive is encapsulated by means of plastic injection grooves or molded shape, it results in poor temperature tolerance, non-ideal heat dissipation and difficult miniaturization. Moreover, because the LED chip 200 is face-up mounted and the structure of gold wires 300 for connecting electrodes is used, the connection failure of gold wires is often the failure mode mostly occurred during the production and use of LED. In addition, the face-up mounted LED chip 200 dissipates heat through sapphire, but has poor heat dissipation effect.

To address the problems existing in the above packaging bracket, a better approach is to use a silicon substrate directly as the packaging substrate of the LED chip. At present, the products of SMD structure based on the silicon substrate still cannot enjoy mass sales and applications in practice, and only some related patents are reported. What is mostly used by them is to: dig a deep groove on the upper surface of the silicon wafer, then dig vias in the groove, connect the electrode in the groove on the upper surface to the lower surface, and form a SMD packaging form; embed the LED chip in the silicon groove, and fill the groove with phosphor and an adhesive at the time of packaging; furthermore, commonly use face-up chips of gold wire bonding. The flip-chip structure is partly used with reference to FIG. 2, the packaging structure including a silicon substrate 10, an LED chip 20 and a packaging adhesive 30, wherein the upper surface of the silicon substrate 10 has a deep groove, the LED chip 20 is flip-chip mounted in the deep groove of the silicon substrate 10. Vias 50 are provided in the groove of the silicon substrate 10 corresponding to the positive and negative electrodes of the LED chip 20. The lower surface of the silicon substrate 10 corresponding to the vias 50 has conductive pads 60 and 70, to which the LED chip 20 is electrically connected by the leads provided in the vias 50. The packaging adhesive 30 is formed by filling the deep groove with phosphor and the encapsulant adhesive. There are the following disadvantages of this kind of structure. The silicon wafer is required to experience corrosion for a long time due to the need for digging a large and deep groove on the upper surface the silicon wafer, with the process complex and the cost higher. Simultaneously with the groove very deep, the difficulty in its internal wiring is increased. Especially if the flip chip is used, it is required to make metal bumps on the electrodes of the groove, with the process difficult. Furthermore, because there is the deep groove on the upper surface of the silicon substrate, it is not easy to integrate LED's peripheral functional circuits (such as anti-static protection circuit, driver circuit, etc.) on the silicon substrate, with the application prospects limited. In addition, the number of chips placed in the groove is limited by the size of the groove, thereby not easy to achieve multi-chip modules.

In the process of production and operation of the light-emitting diode, it is easily damaged by electrostatic, resulting in LED failure, so currently most of the LEDs need to be additionally connected to Zener for electrostatic protection in the packaging process, with the additional operation and cost. The LED is actually a PN junction diode and needs DC power drive to operate. Its operating voltage is determined by the material and PN junction characteristics and is essentially constant, so that its brightness is determined by the operating current. Therefore, to ensure the normal operation of the LED, constant current source drive is generally required, to keep the current constant, so that the LED needs an additional power constant current drive system. In addition, LED's peripheral circuits also includes rectifier circuits (i.e. AC-DC conversion circuit), dimming circuit, load monitoring and diagnosis, etc. These functional circuits are individually packaged with large volume and high cost, but these circuits are actually the integrated circuits manufactured by silicon process. If a part of the circuits can be integrated in the silicon substrate, the degree of integration will be effectively improved, with improved stability and reduced costs.

SUMMARY OF THE INVENTION

The object of the invention is to overcome the shortcomings and deficiencies of prior art to provide a surface mounted LED structure with good thermal performance, small size, low cost and high integration.

Meanwhile, the present invention also provides a packaging method for said LED packaging structure.

A surface mounted LED structure of integrating functional circuits on a silicon substrate includes the silicon substrate and an LED chip. Said silicon substrate has an upper surface of planar structure and without grooves. An oxide layer covers the upper surface of the silicon substrate, and two metal electrode layers for connecting positive and negative electrodes respectively, are arranged in the upper surface of the oxide layer and insulated from each other. The upper surfaces of said metal electrode layers are arranged with metal bumps respectively, and the LED chip is flip-chip mounted to the silicon substrate and has positive and negative electrodes respectively connected to two metal bumps and thus to the metal electrode layers. Two conductive metal pads are respectively arranged on the lower surface of said silicon substrate, and said conductive metal pads are electrically connected to the metal electrode layers on the upper surface of the silicon substrate by a metal lead arranged on the side wall of the silicon substrate. A heat conduction metal pad is arranged on the corresponding lower surface of the silicon substrate just below the LED chip. Peripheral functional circuits required by LED are integrated on the upper surface of said silicon substrate, which are electrically connected to the metal electrode layers by a contact hole through the oxide layer.

Further, The LED packaging structure also includes a colloidal lens arranged on the upper surface of the silicon substrate to form a closed space to causes the LED chip and metal wirings therein to be isolated from environment.

Further, said peripheral functional circuits are one of anti-static protection circuit, power drive circuit, rectifier circuit, dimming circuit, load monitoring and diagnosis circuit, or a combination thereof.

AN LED packaging method of integrating functional circuits on a silicon substrate includes the steps of:

step S1: growing an epitaxial wafer with multiple layers of GaN on a sapphire substrate, and through lithography, etching, metal layer deposition and passivation layer protection process steps, etc., forming P and N electrodes and metal pads on the electrodes, on an LED chip;

step S2: forming peripheral functional circuits, an oxide layer and metal electrode layers on the upper surface of the silicon substrate, and then forming metal bumps on the upper surfaces of the metal electrode layers;

step S3: forming a groove on the lower surface of the silicon substrate;

step S4: covering side walls of the groove and the lower surface of the silicon substrate with an insulating layer by means of electroplating or coating;

step S5: forming a metal lead in the insulating layer surface on the side wall of the groove, forming conductive metal pads in the insulating layer surface on the lower surface of the silicon substrate and forming a heat conduction metal pad on the lower surface of the silicon substrate;

step S6: flip-chip mounting the LED chip to the silicon substrate, and connecting the metal pads corresponding to the P and N electrodes on the LED chip to the metal bumps on the silicon substrate respectively;

step S7: fabricating a colloidal lens above the LED on the upper surface of the silicon substrate.

Compared to prior art, the packaging structure of the present invention has good heat dissipation effect and small volume; meanwhile packaging without gold wires makes the structure highly reliable. The LED chip is directly flip-chip mounted in the surface of the silicon substrate without the step of digging deep grooves in the silicon wafer surface, thereby reducing process costs and process difficulty. Furthermore, the LED chip can be easily arranged in the upper surface of the silicon wafer, and the connection and package of multi-chip modules can be achieved conveniently. Meanwhile, LED's peripheral functional circuits are directly integrated in the surface of the silicon substrate to achieve a high degree of integration of LED packaging structure, resulting in reduced volume of the LED device, reduced costs and increased operation stability. It also achieves large-scale production package of wafer level, reducing the packaging cost.

In order to more clearly understand the present invention, the implementations of the invention are set forth in conjunction with the drawings hereinafter.

BRIEF DESCRIPTION OF THE ACCOMPANYING DRAWINGS

DETAILED DESCRIPTION OF PREFERRED EMBODIMENTS

Figure 1:
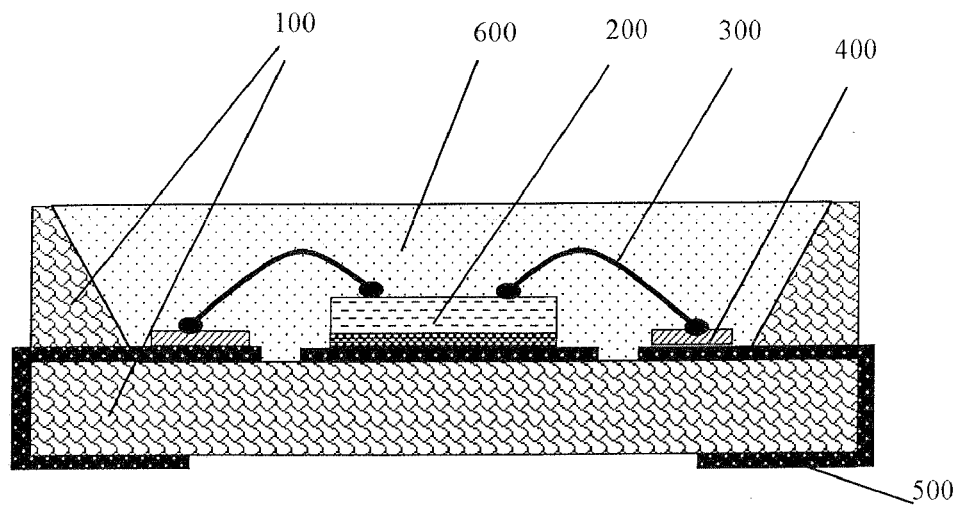
FIG. 1 is a schematic view of a surface mounted LED structure commonly used in prior art.
Figure 2:
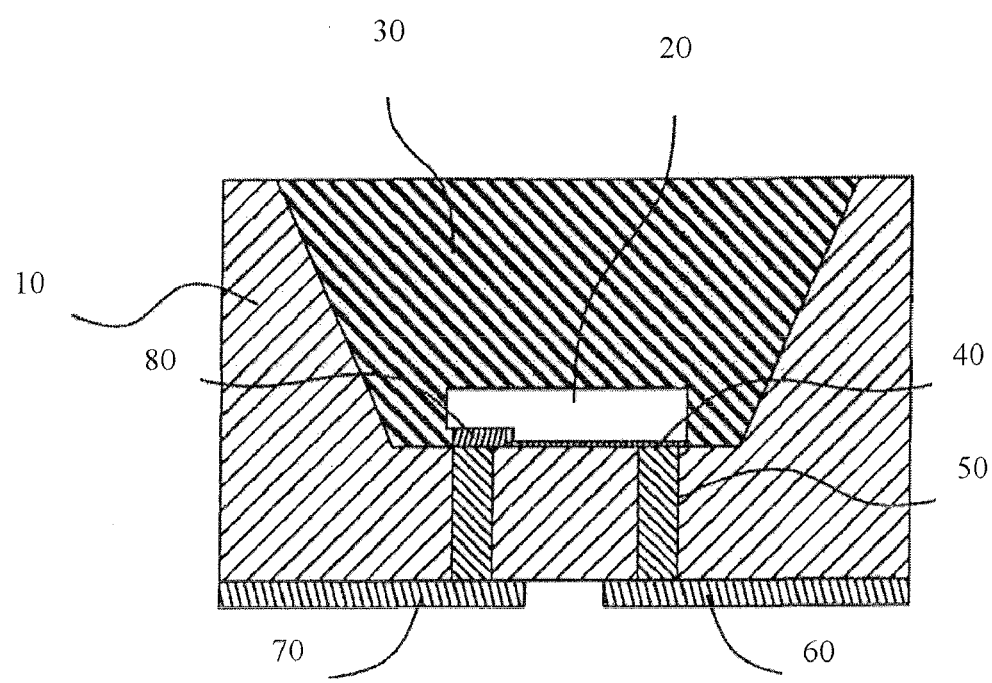
FIG. 2 is a schematic view of a packaging structure which uses an example silicon substrate as the packaging substrate of the LED chip.
Figure 3:
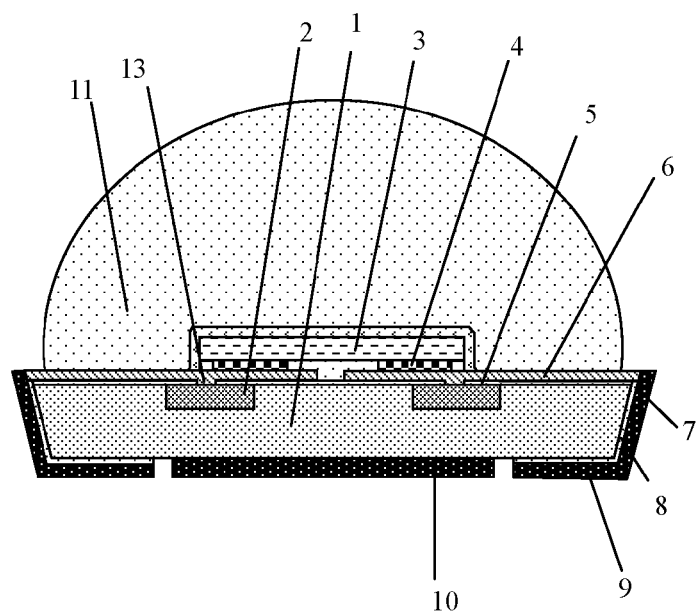
FIG. 3 is a cross section schematic view of an LED packaging structure based on the silicon substrate of the invention.
Figure 4:
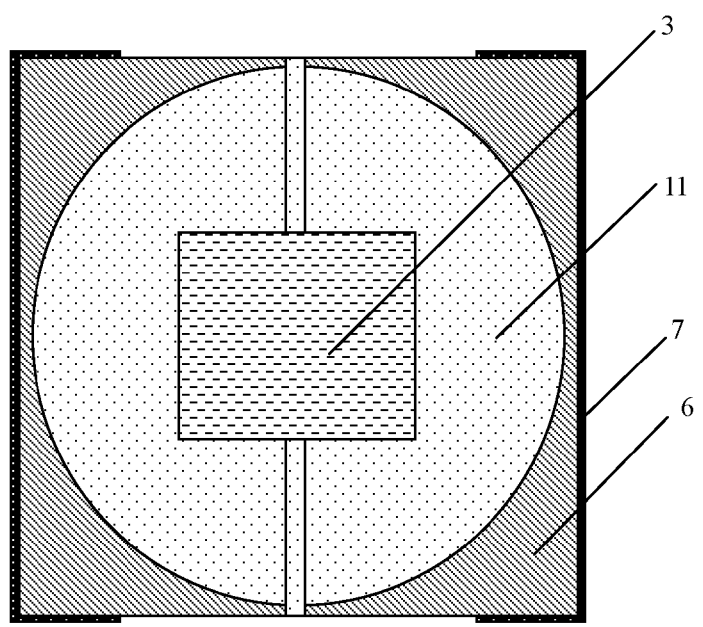
FIG. 4 is a top view of FIG. 3.
Figure 5:
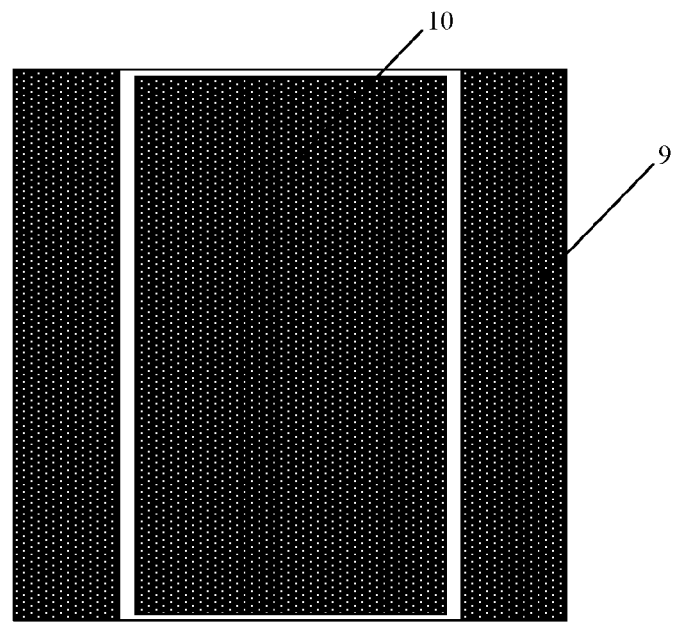
FIG. 5 is a bottom view of FIG. 3.
Figure 6:
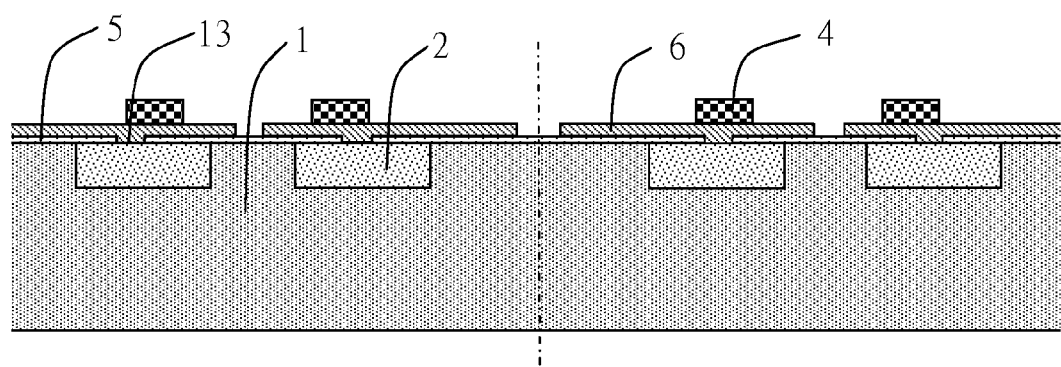
FIG. 6 through 11 are cross section schematic views of various steps of process flow of an LED packaging structure of the invention.
Figure 7:
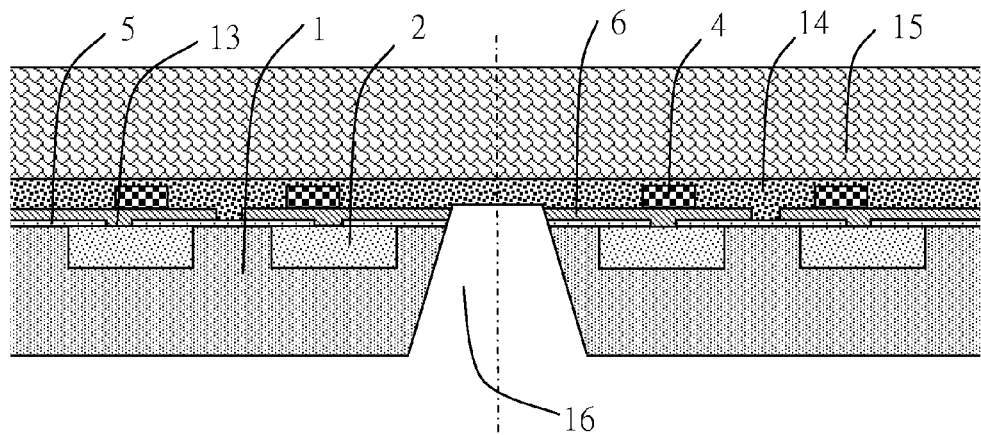
Figure 8:
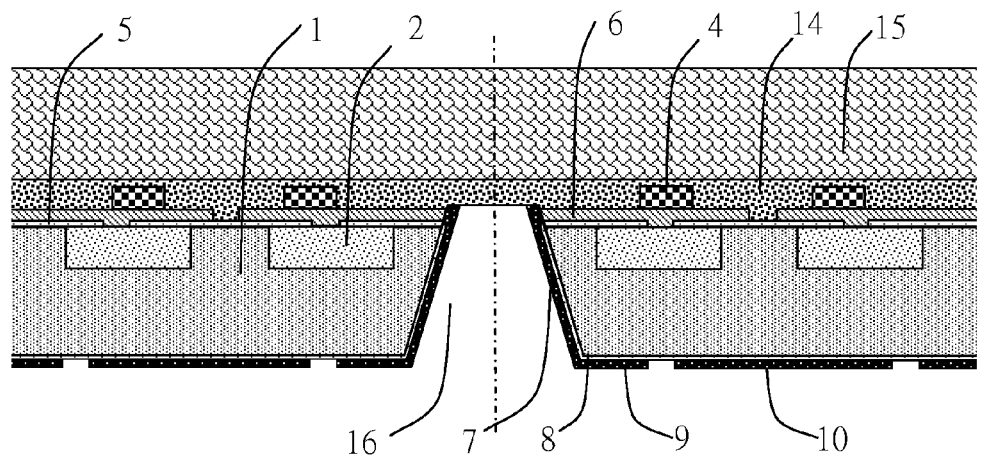
Figure 9:
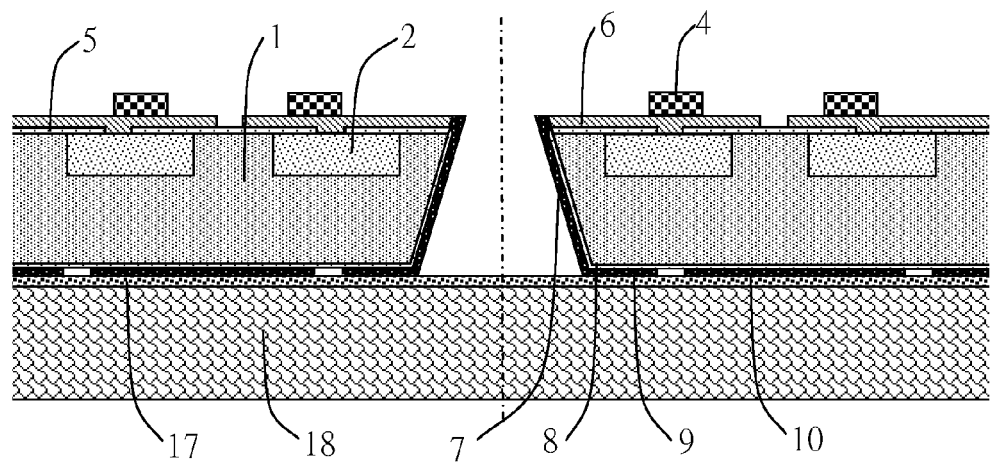
Figure 10:
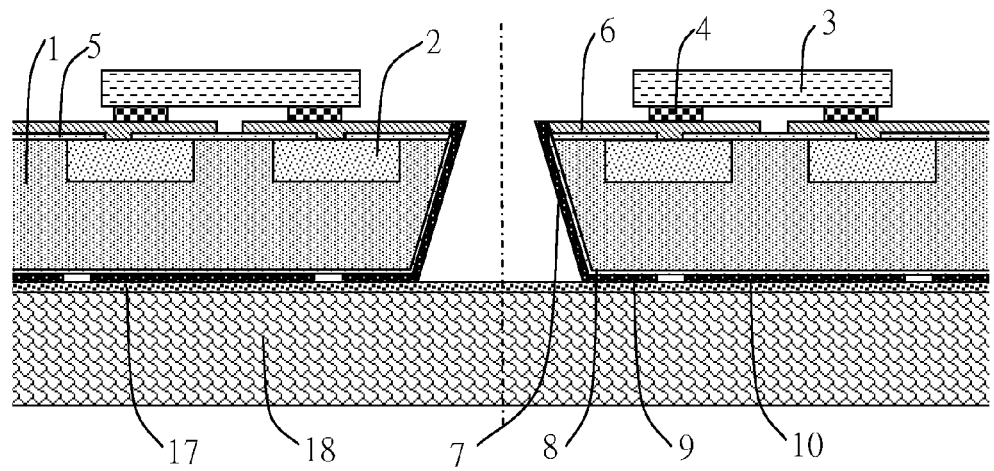
Figure 11:
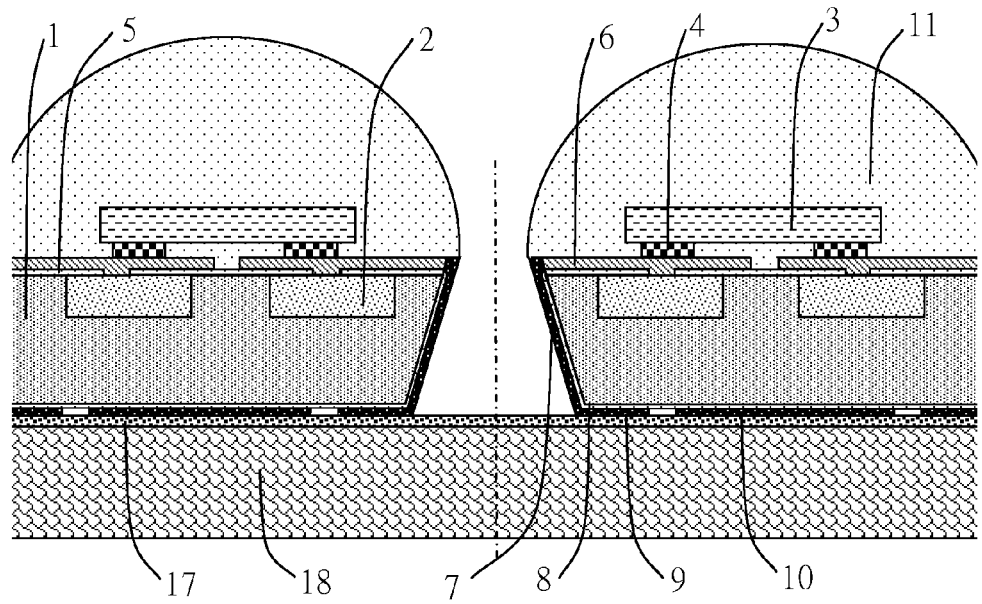

Now refer to FIGS. 3, 4 and 5, which are cross-section schematic view, top view and bottom view of the LED packaging structure based on the silicon substrate of the present invention, respectively. The LED packaging structure includes the silicon substrate 1, an LED chip 3 and a lens 11.

The LED chip 3 has both P and N electrodes, on which metal pads (not shown in the figure) are arranged.

The silicon substrate 1 has an upper surface of planar structure and without grooves. Peripheral functional circuits 2 are integrated in the upper surface of the silicon substrate 1. An oxide layer 5 covers the upper surface of the silicon substrate 1, and a contact hole 13 is formed in the corresponding position of the peripheral functional circuits 2. Two metal electrode layers 6 for connecting positive and negative electrodes respectively are arranged in the upper surface of the oxide layer 5 and insulated from each other. The upper surfaces of the metal electrode layers 6 are respectively arranged with metal bumps 4. The LED chip 3 is flip-chip mounted on the silicon substrate 1, and the electrode metal pads on the positive and negative electrodes of the LED chip 3 are respectively bonded to the metal bumps 4 on the metal electrode layers 6. Two conductive metal pads 9 and one heat conduction metal pad 10 are arranged in the lower surface of the silicon substrate 1, respectively. The conductive metal pads 9 are connected to the metal electrode layers 6 on the upper surface of the silicon substrate 1 by a metal lead 7 arranged on the side wall of the silicon substrate 1. An insulating layer 8 is arranged between the conductive metal pads 9 and the silicon substrate 1 and between the metal lead 7 and the silicon substrate 1. The heat conduction metal pad 10 covers the lower surface of the silicon substrate 1 and directly faces the position of the LED chip 3, with or without any insulating layer between the heat conduction metal pad 10 and the silicon substrate 1.

The lens 11 is arranged on the upper surface of the silicon substrate 1, which forms a closed space to causes the LED chip 3 and the metal wirings therein to be isolated from environment.

Said peripheral functional circuits 2 are specifically one of anti-static protection circuit, power drive circuit, rectifier circuit, dimming circuit, load monitoring and diagnosis circuit or a combination thereof.

The material of said metal bumps 4 can be single material, multi-layer material or alloy of lead, tin, gold, nickel, copper, aluminum, indium.

The material of the electrode metal pads on the LED chip 3 can be single material, multi-layer material or alloy of nickel, gold, silver, aluminum, titanium, tungsten, cadmium, vanadium, platinum and the likes.

The material of said conductive metal pads 9 and heat conduction metal pad 10 can be single material, multi-layer material or alloy of nickel, gold, silver, aluminum, titanium, tungsten, cadmium, vanadium, platinum and the likes.

The material of said lens 11 is a transparent resin or silicone, or can be a resin or silicone mixed with graininess phosphor, or is composed of two layers of material: the first layer is an adhesive mixed with phosphor or a solid sheet of phosphor, and the second layer is a transparent resin or silicone.

Said insulating layer 8 can be polyimide, silicon oxide, silicon nitride, or photoresist permanently usable after being cured, etc.

Next refer to FIG. 6 through 11, which are cross section schematic views of various steps of process flow of the LED packaging structure of the invention. The steps of manufacturing the LED packaging structure of the invention are described in detail as follows:

Step S1: the LED chip 3 is manufactured. In particular, an epitaxial wafer with multiple layers of GaN is grown on a sapphire substrate, and P and N electrodes and metal pads on the electrodes are formed on the LED chip after lithography, etching, metal layer deposition and passivation layer protection and other process steps. After grinded and polished, the wafer is diced into a singulated LED chip 3.

Step S2: the peripheral functional circuits 2 and the metal electrode layers 6 is formed on the silicon substrate 1. In particular, first through semiconductor production process such as epitaxy, oxidation, lithography, etching, ion implantation, diffusion, annealing, etc., the required LED peripheral circuits 2 is fabricated and the contact hole 13 is formed, on a piece of silicon substrate wafer 1. Then, metal layers 6 are formed on the upper surface of the silicon substrate 1 by evaporation, sputtering or electroplating process etc, and formed as the pattern and connection layer corresponding to the LED chip by lithography, corrosion or lift-off process, etc.

Step S3: the metal bumps 4 are formed. In particular, the metal bumps 4 are formed in the position of metal electrode layers 6 corresponding to the flip-chip LED chip by means of electroplating, evaporation or metal wire bumping, etc.

Step S4: a groove 16 is formed on the lower surface of the silicon substrate 1. A layer of dielectric support wafer 15 which has the same size as the silicon substrate 1 and uses the material such as silicon, glass, metal or ceramic, etc., is adhered onto the upper surface of the silicon substrate 1 for protecting the upper surface and supporting the lower surface after etched. Then the lower surface of the silicon substrate 1 is grinded to desired thickness. Then the lower surface of the silicon substrate 1 is subject to dielectric layer deposition, coating, exposure, development, and corrosion processes, etc., and a window pattern for masking the dielectric layer is formed in the scribing location between dies of the silicon substrate 1. The dielectric layer or photoresist is used as a mask layer, and the silicon substrate 1 is subject to dry etching or wet etching, until the silicon wafer is corrupted through to form the groove 16.

Step S5: an insulating layer 8 is formed. The side walls of the groove 16 and the lower surface of the silicon substrate 1 are covered with an insulating layer 8 by means of electroplating or coating, etc.

Step S6: a metal lead 7, conductive metal pads 9 and a heat conduction metal pad 10 are formed. First by exposure and development, the insulating layer 8 is removed in the side wall of the groove 16 corresponding to the metal electrode layers 6 on the upper surface of the silicon substrate 1. Then, by means of electroplating, electroless plating, etc., the metal lead 7 is formed in the groove 16, and the conductive metal pads 9 and the heat conduction metal pad 10 are formed on the lower surface of the silicon substrate 1. The metal electrode layers 6 are electrically connected to the conductive metal pads on the lower surface of the silicon substrate 1 by the metal lead 7.

Step S7: second support sheet 18 is adhered and the first support sheet 15 is removed. The lower surface of the fabricated silicon substrate 1 is attached onto the second support sheet 18 by second adhesive layer 17, and then the first support sheet 15 on the upper surface of the silicon substrate 1 is removed while the upper surface of the silicon wafer is cleaned.

Step S8: the LED chip 3 is flip-chip bonded to the upper surface of the silicon substrate 1. Individual LED chip 3 is flip-chip bonded to the upper surface of the silicon wafer by an automated flip-chip bonding equipment. The flip-chip bonding process is actually a bonding process of the metal bump 4 with the metal pads of P and N electrodes of the LED chip 3, and can employ the solder-reflow method, or a bonding process of applying ultrasonic wave after heated.

Step S9: a lens 11 is formed. The lens can be fabricated by molding, and also can be directly formed by means of dispensing an adhesive with its own surface tension. If a blue LED is fabricated, then it is not required to coat phosphor, but the lens is directly fabricated on the surface of the silicon wafer. If a white LED is fabricated, then there are three ways to introduce phosphor. The first way is to mix phosphor particles with an encapsulation adhesive uniformly and then fabricate the lens on the surface of the silicon wafer by use of molding or dispensing adhesive. The second way is to coat phosphor on the surface of the LED chip firstly by mixing phosphor particles into the adhesive to form colloidal phosphor, and then conduct coating by means of spray coating, brush coating or dispensing adhesive, etc., and then form the lens on the surface of the silicon wafer with the transparent encapsulation adhesive separately by use of molding or dispensing adhesive. The third way is to attach the fabricated solid sheet of phosphor on the surface of the LED chip and then form the lens on the surface of the silicon wafer with the transparent encapsulation adhesive by use of molding or dispensing adhesive.

After the above steps is completed, the singulated die is taken down from the dielectric wafer, that is a directly applicable LED packaging product integrated with functional circuits.

Embodiment 1

A method of integrating an anti-static protection circuit on the silicon substrate 1 is described in detail hereinafter.

Figure 12:
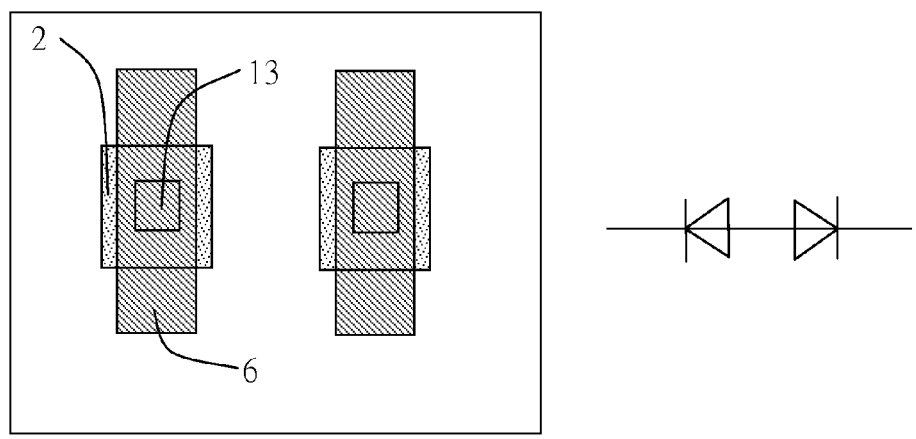
FIG. 12 is a top view and an equivalent circuit diagram of an anti-static protection circuit of Embodiment 1.
Figure 13:
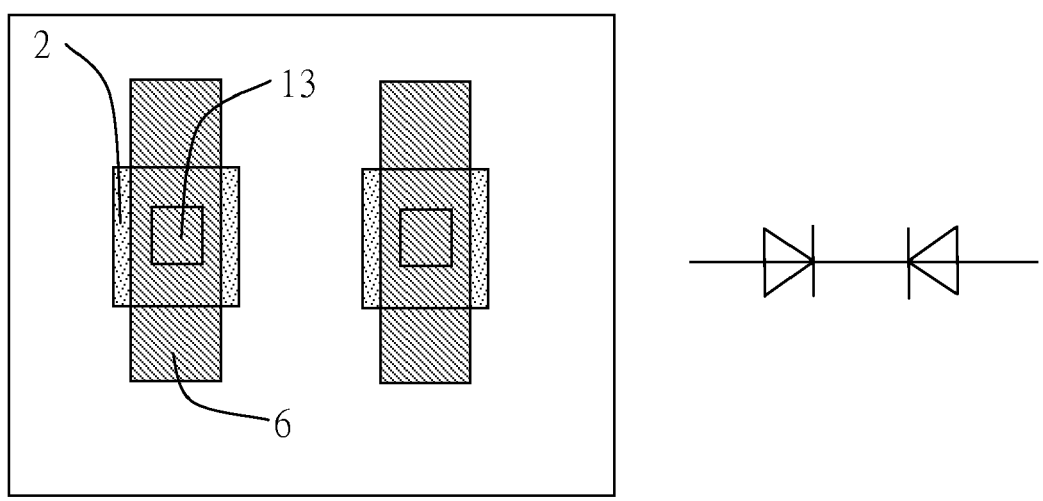
FIG. 13 is a top view and an equivalent circuit diagram of an anti-static protection circuit of Embodiment 2.

It is specifically accomplished in the above step 2. An anti-static protection circuit 2 and metal electrode layers 6 are formed on the silicon substrate 1. The top view and equivalent circuit view of the specific anti-static protection circuit are shown in FIG. 12 with the circuit connected in parallel to the two electrodes of the LED chip. The production process is to:

select a P-type doped silicon substrate 1 of certain resistivity, firstly conduct thermal oxidation process on the surface to form an oxide layer 5, and then form a window in the position required to be doped through lithography and corrosion, and use ion implantation or diffusion process to form a n-type heavily doped region 2 in the window position, the doping concentration and depth determined according to the required reverse breakdown voltage of the PN junction; conduct thermal oxidation on the surface of the silicon wafer again while being doped, and a layer of oxide also covers the N-type doped region 2; then through lithography and corrosion processes a contact hole 13 is formed in the N-type doped region, after which the metal layers 6 are deposited on the surface by evaporation or sputtering process and then the wiring layer 6 for electrode metal connection is formed by lithography and corrosion processes.

Embodiment 2

Another method of integrating an anti-static protection circuit on the silicon substrate 1 is described in detail hereinafter.

It is specifically accomplished in the above step 2. An anti-static protection circuit 2 and metal electrode layers 6 are formed on the silicon substrate 1. The top view and equivalent circuit view of the specific anti-static protection circuit are shown in FIG. 12 with the circuit connected in parallel to the two electrodes of the LED chip. A N-type doped silicon substrate 1 of certain resistivity is selected. Firstly thermal oxidation process is conducted on the surface to form an oxide layer 5, and then a window is formed in the position required to be doped through lithography and corrosion. Ion implantation or diffusion process is used to form a P-type heavily doped region 2 in the window position, wherein the doping concentration and depth are determined according to the required reverse breakdown voltage of the PN junction. Thermal oxidation is again conducted on the surface of the silicon wafer while being doped, and a layer of oxide also covers the P-type doped region 2. Then through lithography and corrosion processes a contact hole 13 is formed in the P-type doped region, after which the metal layers 6 are deposited on the surface by evaporation or sputtering process and then the wiring layer 6 for electrode metal connection is formed by lithography and corrosion processes.

There are various types of peripheral functional circuits of LED and a variety of implementations of the same circuit, so herein it is not necessary to make illustration one by one.

Compared to prior art, the present invention employs a silicon layer as the packaging substrate, and exports the heat generated by the LED chip directly through the silicon, with the thermal resistance relatively smaller. The flip-chip process is used to connect the LED to the silicon substrate directly through the metal bumps, which has better heat dissipation effect than face-up LED products that dissipate heat through sapphire. The entire packaging structure has not any gold wires, thereby reducing reliability issues due to connection failure of gold wires. The present invention directly flip-chip mounts the LED chip in the surface of the silicon substrate. With no grooves dug on the surface of the silicon wafer, thus the LED's peripheral functional circuits such as anti-static protection circuit, LED constant current driver circuit, etc., can be directly integrated in the surface of the silicon substrate to achieve a high degree of integration of LED packaging structure, resulting in reduced volume of the LED device, reduced costs and increased operation stability. With no grooves on the surface of the silicon wafer, the LED chip can be easily arranged in the upper surface of the silicon wafer, and the connection and package of multi-chip modules can be achieved conveniently. This packaging method achieves large-scale production package of wafer level, resulting in the reduction of the packaging cost. In addition, heat conduction metal pad is also arranged on the lower surface of the silicon substrate to achieve the thermal-electrical separation, which can meet the cooling requirements of high power LED lights and improve the reliability of its performance.

The present invention is not limited to the above implementations. If changes and variations of the invention are not departed from the spirit and scope of the invention, and these changes and variations fall within the scope of the claims of the invention and equivalent technology, then the present invention is also intended to encompass these changes and variations.

What is claimed is:

1. A surface mounted LED structure of integrating functional circuits on a silicon substrate, comprising the silicon substrate and an LED chip, wherein said silicon substrate has an upper surface of planar structure and without grooves, an oxide layer covers the upper surface of the silicon substrate, two metal electrode layers for connecting positive and negative electrodes respectively, are arranged in the upper surface of the oxide layer and insulated from each other, and the upper surfaces of said metal electrode layers are arranged with metal bumps respectively; the LED chip is flip-chip mounted to the silicon substrate and has positive and negative electrodes respectively connected to two metal bumps and thus to the metal electrode layers; two conductive metal pads are respectively arranged on the lower surface of said silicon substrate, said conductive metal pads are electrically connected to the metal electrode layers on the upper surface of the silicon substrate by a metal lead arranged on the side wall of the silicon substrate, and a heat conduction metal pad is arranged on the corresponding lower surface of the silicon substrate just below the LED chip; peripheral functional circuits required by LED are integrated on the upper surface of said silicon substrate, which are electrically connected to the metal electrode layers by a contact hole through the oxide layer.

2. The LED packaging structure of claim 1, further comprising a colloidal lens arranged on the upper surface of the silicon substrate to form a closed space to causes the LED chip and metal wirings therein to be isolated from environment.

3. The LED packaging structure of claim 1, wherein said peripheral functional circuits are one of anti-static protection circuit, power drive circuit, rectifier circuit, dimming circuit, load monitoring and diagnosis circuit, or a combination thereof.

* * * * *